United States Patent
Kwon et al.

(10) Patent No.: US 7,711,347 B2
(45) Date of Patent: May 4, 2010

(54) MIXER

(75) Inventors: Ick-jin Kwon, Yongin-si (KR);
Yun-seong Eo, Suwon-si (KR);
Heung-bae Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 442 days.

(21) Appl. No.: 11/414,346

(22) Filed: May 1, 2006

(65) Prior Publication Data

US 2007/0004369 A1   Jan. 4, 2007

(30) Foreign Application Priority Data

Jul. 1, 2005   (KR)   ...................... 10-2005-0059159

(51) Int. Cl.
*H04B 1/28*   (2006.01)
(52) U.S. Cl. ........................ 455/333; 455/319; 455/326
(58) Field of Classification Search .......... 455/313–333
See application file for complete search history.

(56) References Cited

U.S. PATENT DOCUMENTS 5,767,726 A * 6/1998 Wang .......................... 327/356
5,854,569 A * 12/1998 Kohno et al. ................. 327/543
6,639,446 B2 * 10/2003 Komurasaki et al. ......... 327/355
7,161,406 B1 * 1/2007 Ferris .......................... 327/359
7,215,940 B2 * 5/2007 Goddard et al. .............. 455/326
7,277,682 B2 * 10/2007 Zhou ........................ 455/127.1
7,420,418 B2 * 9/2008 Park et al. .................... 330/277
2003/0052727 A1 * 3/2003 Komurasaki et al. ......... 327/356
2004/0224658 A1 * 11/2004 Borremans ................... 455/323
2005/0064840 A1 * 3/2005 Heydari et al. ............... 455/323
2005/0118979 A1 * 6/2005 Langenberg et al. ......... 455/333
2006/0135109 A1 * 6/2006 Klumperink et al. ......... 455/323
2006/0252401 A1 * 11/2006 Rosik et al. .................. 455/323
2007/0243848 A1 * 10/2007 Behzad ........................ 455/326

* cited by examiner

*Primary Examiner*—Edward Urban
*Assistant Examiner*—RuiMeng Hu
(74) *Attorney, Agent, or Firm*—Sughrue Mion, PLLC

(57) ABSTRACT

Provided is a mixer including: an amplifier amplifying an input signal using at least one amplifier element; a mixing unit mixing the input signal amplified by the amplifier with a local oscillator signal output from a local oscillator. The mixing unit includes at least one pair of switching elements switching the amplifier, and the switching elements are MOSFETs having gates and body nodes to which a same local oscillator signal is applied. Thus, a time required for turning on the switching elements can be reduced, and 1/f noise is also reduced. Also, an overdrive voltage can be increased with respect to local oscillator signals having an identical intensity. Thus, a relatively low voltage operation can be performed.

6 Claims, 2 Drawing Sheets

MIXER

CROSS-REFERENCE TO RELATED APPLICATIONS

This application claims priority from Application No. 10-2005-0059159 filed on Jul. 1, 2005 in the Korean Intellectual Property Office, the disclosure of which is incorporated herein by reference.

BACKGROUND OF THE INVENTION

1. Field of the Invention

The present invention relates to a mixer, and more particularly, to a mixer reducing the time required for turning on a switching element in order to reduce 1/f noise.

2. Description of the Related Art

Direct transformation receivers have been studied as a receiver structure for realizing single chips. Such a direct transformation receiver can reduce external elements such as a filter or the like which burden the processing of a digital signal. Thus, the direct transformation receiver is most suitable for manufacturing single chips using a complementary metal-oxide semiconductor (CMOS) process by which digital circuits are easily realized. A direct transformation receiver may be classified into either a radio frequency (RF) direct transformation receiver transforming an RF signal into a base band signal or an intermediate frequency (IF) direct transformation receiver transforming an RF signal into a specific IF signal and then the specific IF signal into a base band.

A mixer used in such a direct, transformation receiver mixes an RF signal with a local oscillator (LO) signal to output a base band signal.

FIG. 1 is a circuit diagram of a conventional mixer using a CMOS Gilbert cell used in an RF direct transformation receiver. As shown in FIG. 1, the mixer includes an amplifier 20 and a mixing unit 10.

The amplifier 20 includes a pair of amplifier elements MA1 and MA2 and amplifies an input signal and provides the amplified signal to the mixing unit 10.

The mixing unit 10 includes first and second switching elements MS1 and MS2 switching an output current of the amplifier element MA1 and third and fourth switching elements MS3 and MS4 switching an output current of the amplifier element MA2. A local oscillator signal LO+ is input from a local oscillator to gates of the first and fourth switching elements MS1 and MS4, and a local oscillator signal LO− is input from the local oscillator to a common gate of the second and third switching elements MS2 and MS3. Here, the local oscillator signal LO+ input to first and fourth switching elements MS1 and MS4 is 180° out of phase with the local oscillator signal LO− input to the second and third switching elements MS2 and MS3. Drains of the second and fourth switching elements MS2 and MS4 are connected to each other, and drains of the third and first switching elements MS3 and MS1 are connected to each other.

The mixing unit 10 mixes a signal amplified by an amplifier element with a local oscillator signal to output a signal corresponding to a difference between frequencies of the signals. The amplifier elements MA1 and MA2 and the first, second, third, and fourth switching elements MS1, MS2, MS3, and MS4 constituting the mixer are realized as n-channel metal-oxide semiconductor field effect transistor (MOSFET) elements.

However, if the mixer uses such a MOSFET and a current is provided to the first, second, third, and fourth switching elements MS1, MS2, MS3, and MS4, the first, second, third, and fourth switching elements MS1, MS2, MS3, and MS4 require a predetermined turn-on time to be turned on and reach a target voltage. Such a turn-on time increases 1/f noise additionally offsetting a direct current (DC) and deteriorating a noise figure. In particular, the 1/f noise increases with changes from a high frequency to a low frequency. Thus, the first, second, third, and fourth switching elements MS1, MS2, MS3, and MS4 cause such problems in an RF direct transformation receiver outputting a low frequency base band signal.

$i_{o,n}$ indicating the 1/f noise output from the mixer can be expressed as in Equation 1:

$$i_{o,n} = \frac{2}{T} \times 2I \times \Delta t \tag{1}$$

According to Equation 1, a time T may be increased, a supplied current I may be decreased, or a turn-on time $\Delta t$ may be decreased in order to decrease the 1/f noise. However, a frequency must be lowered to increase the time T. In general, since a receiver and a transmitter use a frequency in a specific band, it is impossible to lower the frequency. If the current I is reduced, the performance of the mixer may be deteriorated. Thus, decreasing the turn-on time $\Delta t$ may be desirable. Therefore, a method of decreasing the turn-on time $\Delta t$ of the mixer is required to reduce the 1/f noise in the RF direction transformation receiver.

SUMMARY OF THE INVENTION

Exemplary embodiments of the present invention overcome the above disadvantages and other disadvantages not described above. Also, the present invention is not required to overcome the disadvantages described above, and an exemplary embodiment of the present invention may not overcome any of the problems described above.

An aspect of the present invention provides a mixer decreasing a turn-on time of a switching element to reduce 1/f noise.

According to an aspect of the present invention, there is provided a mixer including: an amplifier amplifying an input signal using at least one amplifier element; a mixing unit mixing the input signal amplified by the amplifier with a local oscillator signal output from a local oscillator. Here, the mixing unit may include at least one pair of switching elements switching the amplifier, and the switching elements are metal-oxide semiconductor field effect transistors (MOSFETs) having gates and body nodes to which a same local oscillator signal is applied.

One of the switching elements may include a gate and a body to which a positive local oscillator signal LO+ is applied, and the other one of the switching elements may include a gate and a body to which a negative local oscillator signal LO− 180° out of phase with the positive local oscillator signal LO+ is applied.

A gate and a body node of each of the switching elements may be electrically connected to each other.

The switching elements may be n-channel MOSFETs or p-channel MOSFETs.

A current source may be input to the at least one amplifier element of the switching elements.

BRIEF DESCRIPTION OF THE DRAWINGS

The above and/or other aspects of the present invention will become more apparent by describing certain exemplary embodiments of the present invention with reference to the accompanying drawings, in which.

DETAILED DESCRIPTION OF THE EXEMPLARY EMBODIMENTS

Figure 1:
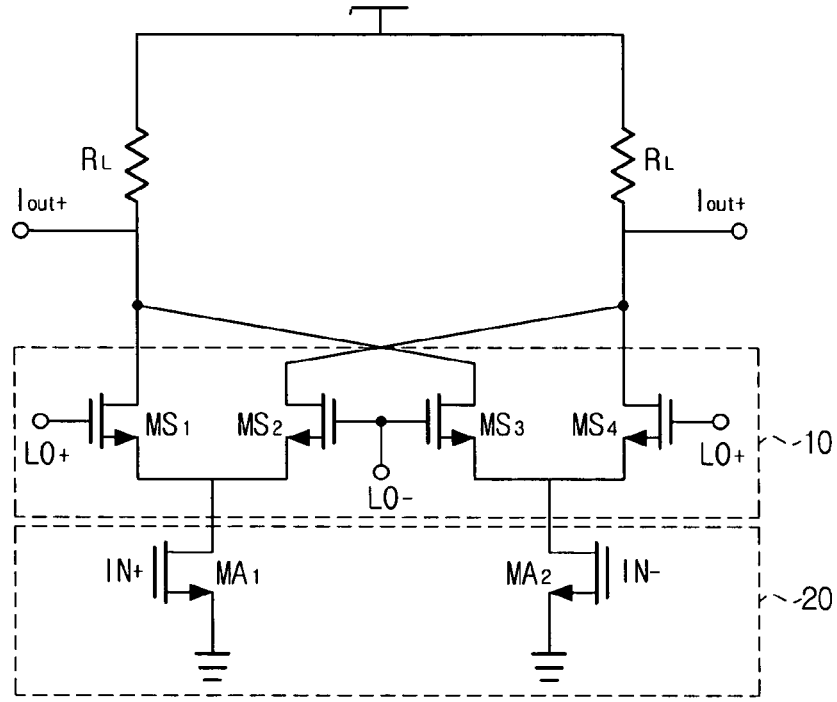
FIG. 1 is a circuit diagram of a conventional mixer using a CMOS Gilbert cell used in an RF direct transformation receiver.

Certain exemplary embodiments of the present invention will be described in greater detail with reference tp the accompanying drawings.

In the following description, same drawing reference numerals are used for the same elements even in different drawings. The matters defined herein are described at a high level of abstraction to provide a comprehensive yet clear understanding of the invention. Also, well-known functions or constructions are not described in detail since they would obscure the invention in unnecessary detail.

Figure 2:
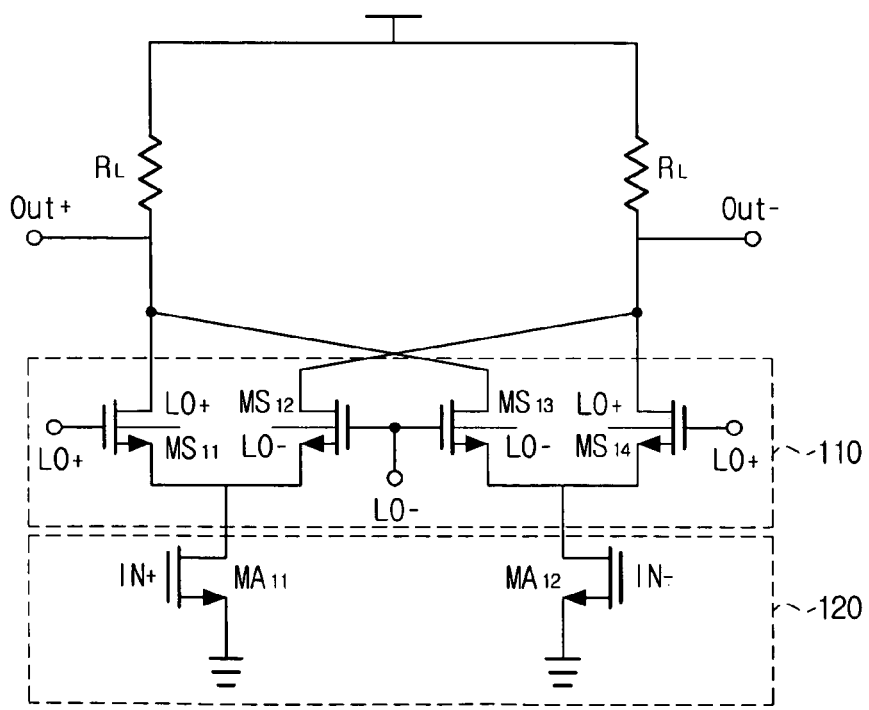
FIG. 2 is a circuit diagram of a Gilbert cell mixer according to an exemplary embodiment of the present invention.

FIG. 2 is a circuit diagram of a Gilbert mixer according to an exemplary embodiment of the present invention. As shown in FIG. 2, the Gilbert mixer includes an amplifier 120 amplifying an input signal and a mixing unit 110 mixing the input signal from the amplifier 120 with a local oscillator signal.

The amplifier 120 includes a pair of amplifier elements MA11 and MA12, which amplify the input signal, and provide the amplified signal to the mixing unit 110. Here, the amplifier elements MA11 and MA12 are n-channel MOSFETs.

The mixing unit 110 includes first and second switching elements MS11 and MS12 switching an output current of the amplifier element MA11 and third and fourth switching elements MS13 and MS14 switching an output current of the amplifier element MA12. Here, the first, second, third, and fourth switching elements MS11, MS12, MS13, and MS14 are n-channel MOSFETs.

A local oscillator signal LO+ is input from a local oscillator to gates of the first and fourth switching elements MS11 and MS14. Here, the gate of the first switching element MS11 is connected to a body node of the first switching element MS11. Thus, the local oscillator signal LO+ is input from the local oscillator simultaneously to the gate and body node of the first switching element MS11. The gate of the fourth switching element MS14 is connected to a body node of the fourth switching element MS14. Thus, the local oscillator signal LO+ is input from the local oscillator to the body node and gate of the fourth switching element MS14.

The second and third switching elements MS12 and MS13 use a common gate to which a local oscillator signal LO– which is 180° out of phase with the local oscillator signal LO+ provided to the first and fourth switching elements MS11 and MS14 is input from the local oscillator. The common gate is connected to a body node of the second switching element MS12, and thus local oscillator signal LO– is simultaneously input to the body node of the second witching element MS12 and the common gate. The common gate is also connected to a body node of the third switching element MS13, and thus the local oscillator signal LO– is simultaneously input to the body node of the third switching element MS13 and the common gate.

As described above, in the Gilbert mixer, the local oscillator signal LO+ is input to the gates and bodies of the first and fourth switching elements MS11 and MS14, and the local oscillator signal LO– is input to the gates and bodies of the second and third switching elements MS12 and MS13.

Conventionally, a body node of a MOSFET is connected to a source so as to efficiently prevent reverse biased pn junctions. However, in the present invention, gates and bodies of switching elements are connected to one another so that a local oscillator signal is simultaneously input to the gates and bodies of the switching elements. Thus, the bodies are increasingly biased and threshold voltages $V_{TH}$ of the switching elements are reduced. An overdrive voltage for turning on the switching elements is defined as a difference between a voltage $V_{GS}$ between a gate and source and a threshold voltage $V_{TH}$. Thus, if the threshold voltage $V_{TH}$ is decreased, the difference between the voltage $V_{GS}$ and the threshold voltage $V_{TH}$ is increased. As a result, the overdrive voltage is increased.

If the overdrive voltage is increased, the switching elements are quickly turned on with respect to local oscillator signals having the same intensity. Thus, Δt in Equation 1 discussed above is reduced. As a result, 1/f noise, which increases with an increase in the turn-on time Δt, is decreased. Also, the overdrive voltage may be increased with respect to the local oscillator signals having the same intensity. Thus, a relatively low voltage operation may be performed.

Figure 3:
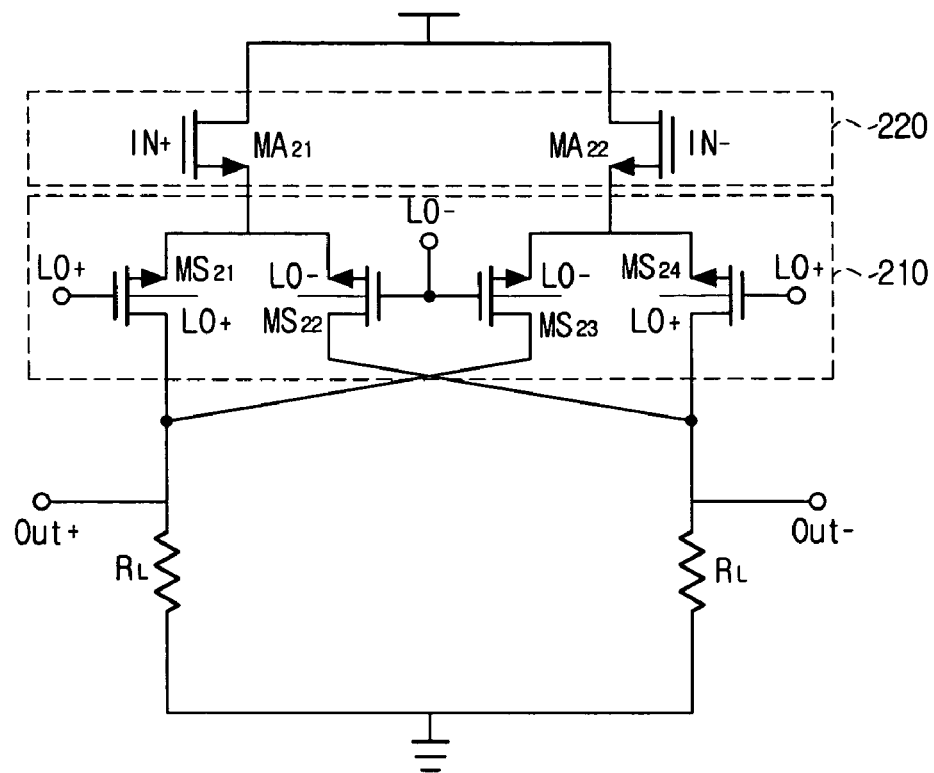
FIG. 3 is a circuit diagram of a Gilbert cell mixer according to another exemplary embodiment of the present invention.

FIG. 3 is a circuit diagram of a Gilbert mixer according to another exemplary embodiment of the present invention. The Gilbert mixer of the present exemplary embodiment includes an amplifier 220 and a mixing unit 210 like the Gilbert mixer shown in FIG. 2.

The amplifier 220 includes a pair of amplifier elements MA21 and MA22 implemented with p-channel MOSFETs.

The mixing unit 210 includes first and second switching elements MS21 and MS22 switching an output current of the amplifier element MA21 and third and fourth switching elements MS23 and MS24 switching an output current of the amplifier element MA22. The first, second, third, and fourth switching elements MS21, MS22, MS23, and MS24 are p-channel MOSFETs.

Here, a gate and a body node of the first switching element MS21 are connected to each other, and thus a local oscillator signal LO+ is input from a local oscillator simultaneously to the gate and the body of the first switching element MS21. Also, a gate and a body node of the fourth switching element MS24 are connected to each other, and thus the local oscillator signal LO+ is input from the local oscillator simultaneously to the gate and the body node of the fourth switching element MS24.

The second and third switching elements MS22 and MS23 use a common gate connected to bodies of the second and third switching elements MS22 and MS23. Thus, a local oscillator signal LO– is simultaneously input from the local oscillator to common gate and the bodies of the second and third switching elements MS22 and MS23.

The Gilbert mixer of the present exemplary embodiment is only different from the Gilbert mixer shown in FIG. 2 in that it uses p-channel MOSFETs and thus possesses the same efficiency as the Gilbert mixer shown in FIG. 2. In other words, in the Gilbert mixer of the present exemplary embodiment, a turn-on time Δt is decreased, and thus 1/f noise is decreased. Also, an overdrive voltage is increased with respect to local oscillator signals having the same intensity. Thus, a relatively low voltage operation can be performed.

Figure 4:
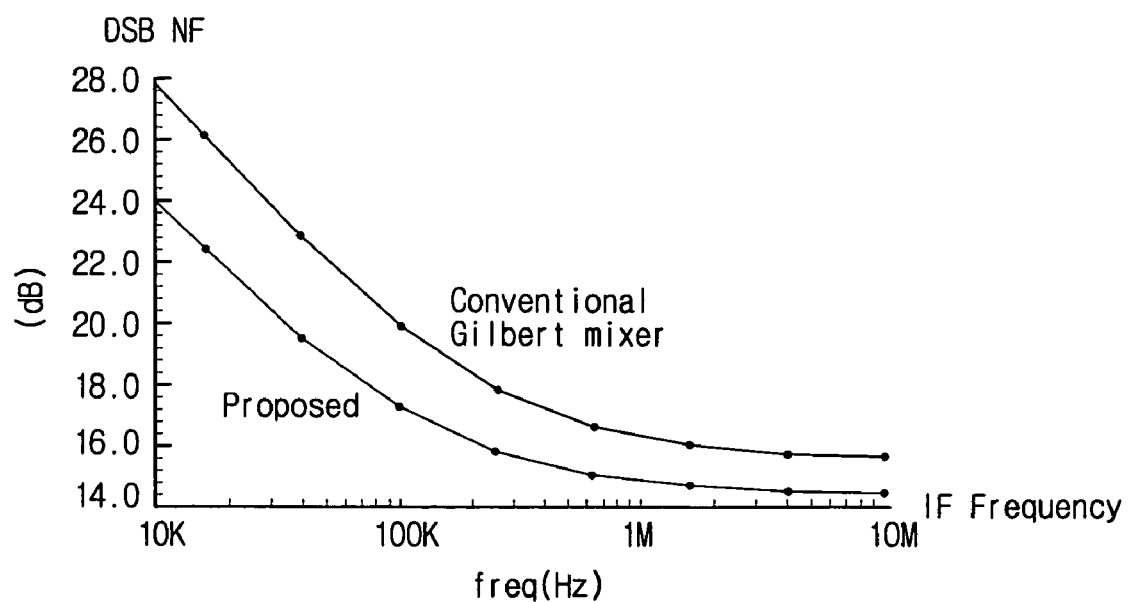
FIG. 4 is a graph illustrating a variation in noise measured using a mixer of the present invention, with respect to an output frequency.

A variation in noise measured using the Gilbert mixer shown in FIG. 2 or 3 with respect to an output frequency is shown in FIG. 4.

In FIG. 4, an RF frequency of 0.5 GHz and a local oscillator (LO) frequency varied within a range between 0.5 GHz and 0.510 GHz to measure the noise with respect to the output frequency are utilized. As a result, when the output frequency is within a range between 10 KHz and 10 MHz, the conventional Gilbert cell mixer forms a curve on an upper part of a graph, as shown in FIG. 4. However, the Gilbert mixer of the present invention forms a curve on a lower part of the graph, as shown in FIG. 4. Measuring corner frequencies on the curves of the graph reveals that the Gilbert mixer of the present invention can reduce the 1/f noise by 50% compared to that of the conventional Gilbert cell mixer.

As described above with respect to FIG. 3, gates and body nodes of switching elements constituting the mixing unit 210 are connected to one another to apply a common local oscillator signal so as to decrease a threshold voltage $V_{TH}$ with an increase in biases of the bodies. As a result, an overdrive voltage is increased so that a turn-on operation is quickly performed with respect to local oscillator signals having the same intensity, so as to decrease 1/f noise. Also, a relatively low voltage operation can be performed. The Gilbert mixer of the present invention is most efficient in an RF direct transformation receiver but may be used in IF direction transformation receiver and transmitter as well.

A double-balanced mixer (DBM) has been described in the above-described embodiments. However, a structure applying a local oscillator signal to gates and body nodes of switching elements can also be applied to a single-balanced mixer (SBM).

The Gilbert mixers shown in FIGS. 2 and 3 do not use current sources. However, in a structure using a current source in an amplifier, a local oscillator signal can be applied to gates and body nodes of switching elements.

As described above, according to the present invention, a time required for turning on a switching element can be reduced. Thus, 1/f noise can be reduced. Also, an overdrive voltage can be increased with respect to local oscillator signals having the same intensity. Thus, a relatively low voltage operation can be performed.

The foregoing embodiment and advantages are merely exemplary and are not to be construed as limiting the present invention. The present teaching can be readily applied to other types of apparatuses. Also, the description of the exemplary embodiments of the present invention is intended to be illustrative, and not to limit the scope of the claims, and many alternatives, modifications, and variations will be apparent to those skilled in the art.

What is claimed is:

1. A mixer comprising:
an amplifier which amplifies an input signal using at least first and second amplifier elements;
a mixing unit which mixes the input signal amplified by the amplifier with a local oscillator (LO) signal output from a local oscillator,
wherein the mixing unit comprises at least first and second pairs of metal-oxide semiconductor field effect transistors (MOSFETs),
wherein each of the MOSFETs comprises a gate, a source, a drain and a body node,
wherein the first pair comprises first and second MOSFETs which switch an output current of the first amplifier element, and the second pair comprises third and fourth MOSFETs that switch an output current of the second amplifier element, and
wherein a positive local oscillator signal (LO+) is applied to the gate and the body node of the first MOSFET, and the gate and the body node of the fourth MOSFET, and a negative local oscillator signal (LO−) which is 180° out of phase with the LO+ is applied to the gate and the body node of the second MOSFET and the gate and the body node of the third MOSFET, and
wherein the gate and the body node of the second MOSFET and the gate and the body node of the third MOSFET are connected to one another and the negative local oscillator signal (LO−) is simultaneously input to the gate and the body node of the second and third MOSFETs.

2. The mixer of claim 1, wherein the gate and the body node of each of the MOSFETs are electrically connected to each other.

3. The mixer of claim 2, wherein the switching elements are n-channel MOSFETs.

4. The mixer of claim 2, wherein the switching elements are p-channel MOSFETs.

5. The mixer of claim 1, wherein a current source is input to the at least one amplifier element of the amplifier.

6. The mixer of claim 1, wherein the gate and the body node of the first MOSFET are connected to each other and the positive local oscillator signal (LO+) is simultaneously input to the gate and the body node of the first MOSFET, and
wherein the gate and the body node of the fourth MOSFET are connected to each other and the positive local oscillator signal (LO+) is simultaneously input to the gate and the body node of the fourth MOSFET.

* * * * *